United States Patent
Jin et al.

(10) Patent No.: US 7,869,776 B2
(45) Date of Patent: Jan. 11, 2011

(54) METHOD AND APPARATUS FOR REGULATING THE TRANSMITTED POWER IN MULTI-RATE WIRELESS COMMUNICATION SYSTEMS

(75) Inventors: Xin Jin, Waterloo (CA); Nagula T. Sangary, Waterloo (CA); Muhammad Khaledul Islam, Waterloo (CA); Wen Zhao, Kanata (CA); Nasserullah Khan, Waterloo (CA); Wen-Yen Chan, Waterloo (CA); Qing Zhong Jiao, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

(21) Appl. No.: 12/477,552

(22) Filed: Jun. 3, 2009

(65) Prior Publication Data
US 2009/0239487 A1    Sep. 24, 2009

Related U.S. Application Data

(63) Continuation of application No. 10/700,985, filed on Nov. 4, 2003, now Pat. No. 7,558,540.

(60) Provisional application No. 60/423,354, filed on Nov. 4, 2002.

(51) Int. Cl.
*H01Q 11/12* (2006.01)

(52) U.S. Cl. .................. 455/127.2; 455/115.1; 455/522; 455/550.1

(58) Field of Classification Search .............. 455/67.11, 455/115.1, 127.1, 127.2, 522; 330/130, 136, 330/278, 285
See application file for complete search history.

(56) References Cited

U.S. PATENT DOCUMENTS

| 5,123,031 | A | 6/1992 | Kuisma |
| 5,302,913 | A | 4/1994 | Hori |
| 6,192,040 | B1 | 2/2001 | Jalloul et al. |
| 6,311,047 | B1 | 10/2001 | Gotou |
| 6,674,999 | B2 | 1/2004 | Ramachandran |
| 6,735,420 | B2 | 5/2004 | Baldwin |
| 7,031,741 | B2 | 4/2006 | Lee et al. |
| 7,558,540 | B2 * | 7/2009 | Jin et al. ................ 455/127.2 |

FOREIGN PATENT DOCUMENTS

WO    03052968    6/2003

OTHER PUBLICATIONS

U.S. Appl. No. 10/700,985, Notice of Allowance dated Mar. 2, 2009.

* cited by examiner

*Primary Examiner*—Raymond S Dean
(74) *Attorney, Agent, or Firm*—Mukundan Chakrapani; Borden Ladner Gervais LLP (57) ABSTRACT

A method and apparatus for regulating Tx power in a multi-rate mobile device transmitter containing signal dependent gain stages. A data rate and signal format indicator signal corresponding to the transmitted signal, and a desired reference power signal are fed to a mapper that outputs a calibration value based on the desired reference power level at the antenna. The calibration value controls the power amplifier gain characteristics in real time.

20 Claims, 6 Drawing Sheets

METHOD AND APPARATUS FOR REGULATING THE TRANSMITTED POWER IN MULTI-RATE WIRELESS COMMUNICATION SYSTEMS

CROSS REFERENCE TO RELATED APPLICATIONS

This application is a Continuation application of U.S. Application No. 10/700,985 filed on Nov. 4, 2003, now U.S. Pat. No. 7,558,540, which claims priority from U.S. Provisional Application No. 60/423,354 filed on Nov. 4, 2002, which is incorporated herein by reference.

FIELD OF THE INVENTION

The present invention relates generally to power regulation. More particularly, the present invention relates to power regulation in wireless transmission systems.

BACKGROUND OF THE INVENTION

Many wireless communications standards require accurate regulation of transmitted power depending not only on the radio link, but also on data rates and signal formats (i.e., coding and modulation methods). As an example, cdma2000 has defined requirements for accurate transmitted (Tx) power control, such as open loop and closed-loop power control in the reverse link. The relative power requirements are also defined for each of the various code channels (e.g., pilot, FCH: fundamental channel; SCH: supplemental channel; DCCH: dedicated control channel; etc.) according to their data rates and signal formats. Further information concerning cdma2000 on transmitted power requirements can be found in section 2.1.2 of IS-2000-2, which is incorporated herein by reference. Nor are such requirements only limited to cdma2000. Many other communications standards also have similar requirements, such as 3GPP UMTS, 3GPP2 1xEVDO. To meet these requirements, accurate calibration and compensation methods must be implemented for such impairments as AGC control characteristic nonlinearity. This nonlinearity is a gain control characteristic which appears as a nonlinearity in the AGC amplifier gain as a function of the control voltage input to the AGC amplifier.

A further source of variation is signal dependent gain variation (signal power level dependent gain variation and signal distribution dependent gain variation), which has heretofore not been compensated for. Signal dependent gain variation is mainly due to the non-purely Class-A nature of an amplifier, or nonlinearity of other devices such as mixers. Most significantly, such signal dependent gain variation is observed in the power amplifiers (PA), which require high power efficiency. In order to achieve high power efficiency, many PAs in the market utilize a self-bias design for the wireless mobile devices, in which the amount of bias is dependent on the input signal strength (instantaneous value or its envelope magnitude or both). Thus, a change of input level varies the gain. Changes in either data rate or signal format result in variation of the signal distribution (e.g., peak to average power ratio). Such changes also typically alter the effective gains in such amplifiers.

It is, therefore, desirable to provide a method and apparatus that compensates for signal dependent gain variations.

SUMMARY OF THE INVENTION

It is an object of the present invention to obviate or mitigate at least one disadvantage of previous methods and apparatus that regulate the required Tx power, particularly in a mobile device. It is further object of the present invention to provide a method and apparatus for regulating Tx power in a transmitter that contains stage(s) whose gain is dependent on signal variations.

In a first aspect of the present invention there is provided a mobile device for transmitting a wireless signal. The mobile device comprises a frame generator, a reference power source, a wireless transmitter and an amplifier controller. The frame generator generates a signal having a data rate and signal format. The reference power source generates a desired reference power level. The wireless transmitter has an amplifier with at least one stage that manifests a signal dependent gain, the amplifier receives the generated signal and amplifies the received signal in accordance with a received amplifier control signal to compensate for the at least one stage that manifests the signal dependent gain. The amplifier controller receives from the frame generator the data rate and signal format associated with the generated signal, receives the desired reference power level from the reference power source, maps the desired reference power level, the data rate and signal format to an amplifier control signal value in accordance with known nonlinearities associated with the at least one stage that manifests the signal dependent gain, and for generating the amplifier control signal in accordance with the mapped amplifier control signal value.

In a second aspect of the present invention, there is provided a method of amplifying a generated signal, in a mobile device having an amplifier with at least one stage that manifests a signal dependent gain, an amplifier controller, and a reference power source. The method comprises receiving a data rate and signal format signal associated with the generated signal; determining a desired degree of amplification in accordance with the data rate and signal format signal, and the desired reference power level, and nonlinearities associated with the known signal dependent gain; mapping the determined degree of amplification to an amplifier control signal value; generating an amplifier control signal in accordance with the mapped amplifier control signal value; and amplifying the generated signal in accordance with the generated amplifier control signal to compensate for the at least one stage that manifests the signal dependent gain.

In a third aspect of the present invention there is provided a method of amplifying a generated signal, in a mobile device having an amplifier with at least one stage that manifests a signal dependent gain, an amplifier controller, and a reference power source. The method comprises receiving a data rate and signal format signal associated with the generated signal; select a mapping from an array of mappings, the mapping reflecting known nonlinearities associated with the signal dependent gain, in accordance with the data rate and signal format signal; determining an amplifier control signal value using the selected mapping in accordance with a reference power level received from the reference power source; generating an amplifier control signal in accordance with the mapped amplifier control signal value; and amplifying the generated signal in accordance with the generated amplifier control signal to compensate for the at least one stage that manifests the signal dependent gain.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and apparatus for regulating transmitted (Tx) power, particularly in a mobile device. The present invention provides a method and apparatus for regulating Tx power in a mobile device transmitter supporting multiple data rates and signal formats, and containing signal dependent gain stage(s). Throughout the specification, signal formats refer to coding and modulation methods.

In many power amplifiers, a self-bias design is implemented for efficiency. The self-bias introduces a non-linearity in the amplifier. This non-linearity is signal dependent, and alters the gain characteristic of the amplifier at different signal levels, and with different signal distributions caused by change of data rates and signal formats. Thus, the mapping between a desired reference power level and the control signal value used to generate the required amplification to realize the desired Tx power can vary with the data rate and signal format of the signal to be amplified, as well as with the signal level that is input to the amplifying stage that manifests such non-linearity. These non-linearities are amplifier specific, and arise as a result of both amplifier design, and the specific manufacturing process, thus the non-linearities of two different amplifiers manufactured using the same process may not be identical.

For ease of description, throughout the specification, the transmitter is described by a simplified model. Many of the detailed aspects of the transmitter are not directly related to this invention and are well known to those skilled in the art and are thus intentionally omitted. Such elements include I-Q modulation, up-conversion, and filtering. For the purposes of the present discussion, the transmitter is modeled by two blocks, an AGC amplifier, and an amplifying stage that manifests signal dependent gain variation. The amplifying stage with signal dependent gain variation usually is a power amplifier (PA), but may also include other components such as a mixer. Regardless, the total amount of signal dependent gain variation is modeled as a gain incremental $\Delta G$.

The cdma2000 standard is used as the example for the description of the presently preferred embodiments, however, the present invention can be applied to other communication standards, including 3GPP UMTS and 3GPP2 1xEVDO, as will be well understood by those of skill in the art. To this end, "reference power", as used herein, refers to the particular part of the power in the total transmitted power that the wireless communication standard directly specifies. For example, in IS-2000-2, for RC1 and RC2 (RC stands for "radio configuration"), the reference power in this specification means the total gated on power; for RC3 and above, the reference power means the portion of the power in the pilot channel. All other parts of the total power (if any) are regulated relative to the reference power (e.g., the power in FCH at data rate 9600 bps is +3.75 dB relative to the reference power by default in IS-2000-2).

Figure 1:
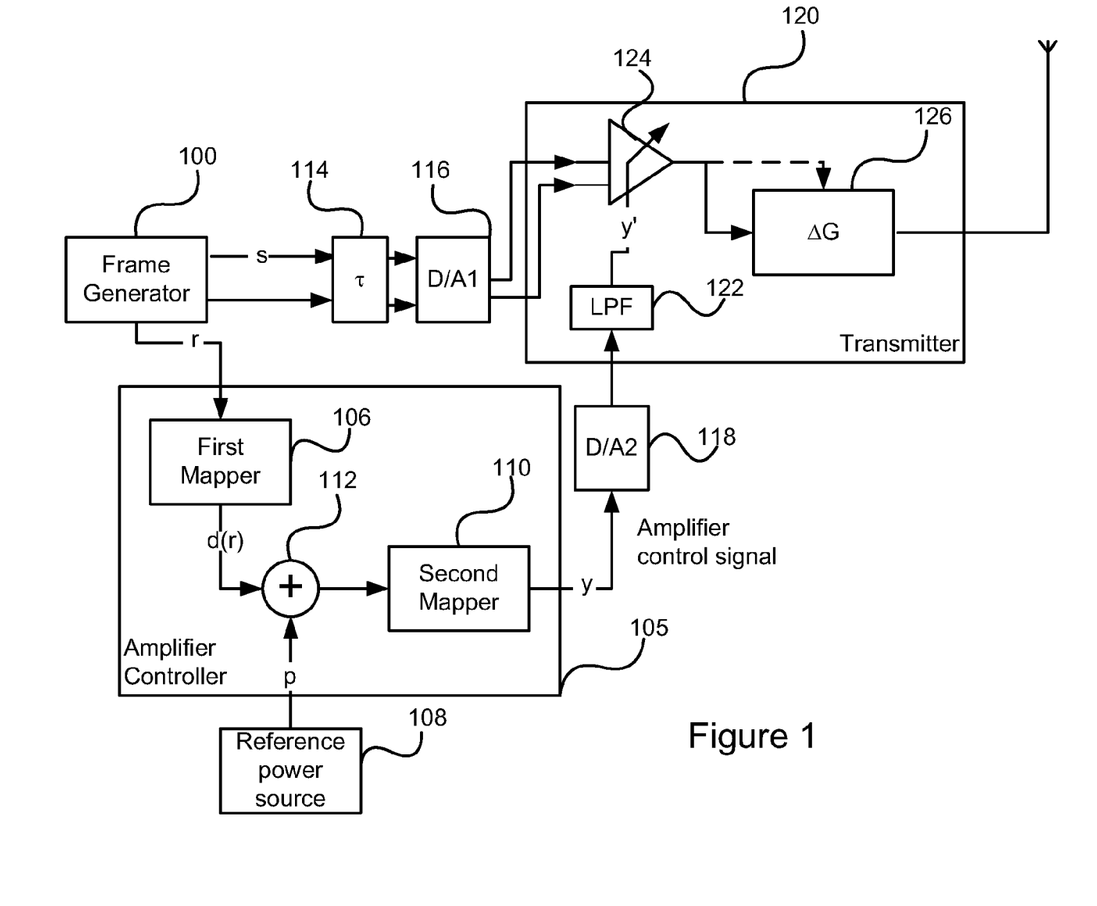
FIG. 1 is a block diagram of a first embodiment of a transmitter system according to the present invention.

As illustrated in FIG. 1, a frame generator 100, such as a data encoder and modulator, generates a signal, s, which is transmitted to an amplifier 124 in transmitter 120. In series with AGC amplifier 124 is the amplifier stage manifesting gain incremental $\Delta G$ 126. Amplifier 124 is controlled by amplifier controller 105 to mitigate the nonlinearities of gain incremental $\Delta G$ 126.

The transmitted signal is gain adjusted by the AGC amplifier 124 in accordance with a control signal y, and then provided to the amplifying stage 126 that manifests the signal dependent gain variation $\Delta G$ 126, whose value is dependent on the input signal level, input signal data rate, and input signal format. For simplicity, the following description ignores sources of gain variation such as temperature, frequency, and battery voltage related gain variations. Instead, the focus is on $\Delta G$ itself and an aspect that is tightly coupled with $\Delta G$: the AGC control characteristic, which is the gain of the AGC amplifier 124 in dB as a function of the control voltage of the voltage-controlled AGC amplifier 124. As used herein and throughout the specification, a "reference signal" or a "reference data rate and signal format" means a data rate and signal format, often arbitrarily chosen, that is used for calibration procedures.

Frame generator 100 generates the encoded and modulated signal frames to be transmitted at one of a plurality of supported data rates. The data rate may vary over time. The total power of the output signal, s, containing the encoded and modulated signal frames, produced by the frame generator is normalized to the same mean power level for all data rates, and the relative power of the individual code channels are also accurately regulated by digital means to the desired values. A data rate and signal format indicator signal, r, is also generated simultaneously by the frame generator. In one embodiment, a delay block "$\tau$" 114 is employed to ensure time alignment of signal s and the amplifier controller signal y. One skilled in the art will appreciate that the delay block "$\tau$" 114 may not physically exist as a delay unit in an implementation, so long as the alignment of signal s and the corresponding amplifier control signal is maintained. The transmitted signal s, after delay alignment and digital to analog conversion at D/A1 116, is fed to the transmitter 120. Signal s is gain adjusted by AGC amplifier 124 and is affected by signal dependent gain, $\Delta G$ 126, before it is transmitted.

On a second data path, data rate and signal format indicator r, is provided by frame generator 100 and is received by a first mapper 106 in amplifier controller 105. First mapper 106 contains a mapping from the data rate and signal format r to a gain adjustment amount d(r) that is generated through a calibration process to ensure that the nonlinearities of signal dependent gain $\Delta G$ 126, are properly compensated for. The process of calibration is discussed in greater detail below. This adjustment d(r) is a value in dB or proportional to dB by a scaling factor. For a chosen reference data rate, denoted as $r_{ref}$, the value $d(r_{ref})$ is set as 0 dB. A reference power source 108 produces the desired reference power level p that is expected at the antenna in dBm (or in a unit proportional to dBm by the same scaling factor as used in d(r), if any). One skilled in the art will appreciate that the system can be simplified by ensuring that the scaling factor used in p for the power expected at the antenna, is the same scaling factor used in d(r) for the gain offset. In cdma2000 mobile devices, reference power level p is derived from both the open loop and closed-loop power control system. This derivation of reference power level p is well understood in the art. Both d(r) and p are provided to a second mapper 110, preferably after being combined by an adder 112. With proper calibration of first mapper 106, the value resulting from the additive combination of d(r) and p is related to the desired degree of amplification for signal s. This value is provided to the second mapper 110 to map to an amplifier control signal y. The mapping table values in the second mapper 110 are determined by calibration procedures that reflect implementation specific information about AGC amplifier 124, signal dependent gain variation 126 and other elements of transmitter 120. The amplifier control signal y is provided to a control input of amplifier 124, and is preferably aligned with signal s in time at the output of AGC amplifier 124.

Signal s and amplifier control signal y are preferably converted from digital signals to analog representations of the digital signals by digital-to-analog converters 116 and 118, respectively. The analog representation of amplifier control y may also be low-pass-filtered by LPF 122, to smooth the control of amplifier 124. AGC amplifier 124 then amplifies the analog representation of signal s in accordance with smoothed amplifier control signal y', the analog representation of y, or a filtered version thereof. The result of the amplification is that signal s is amplified in a manner that compensates for the signal dependent gain $\Delta G$ 126.

The method to calibrate the first mapper 106 and the second mapper 110 mapping table values will now be described. Using a reference signal generated by the frame generator 100 with a reference data rate and signal format, the second mapper 110 output value y is calibrated by the system of the presently illustrated embodiment as follows. For a reference data rate and signal format $r_{ref}$ the value $d(r_{ref})$ is defined as 0 dB, for each given value p, the second mapper 110 adjusts output value y corresponding to p so that the transmitted reference power measured at the antenna is the expected value p. Note that the manner in which the value y is determined already compensates both the nonlinear relationships in the transmitter, i.e., the gain in dB of amplifier 124 as a function of the value of the amplifier control signal y, and variation in the $\Delta G$ 126 as a function of the input signal level, where the input signal for calibration is the selected reference data rate and signal format. For example, choosing RC1 in IS-2000-2 as the reference signal, the reference power is the total gated on transmitted power. The calibrated value y stored in the second mapper results in the expected total transmitted power p at antenna for any value of p generated by the reference power source 108.

The output of the first mapper 106, d(r), is preferably calibrated as follows: for each data rate and signal format r that the mobile device supports, and for a pre-selected value of p, the value d(r) is adjusted so that the transmitted output reference power measured at the antenna for data rate r is p. Note the manner in which the value d(r) is determined results in d(r) being composed of two parts. The first part accounts for the difference in dB in total transmitted power between r and $r_{ref}$, given the same reference power, where r and $r_{ref}$ are the current and the reference data rates and signal formats, respectively. This part usually can be pre-calculated according to standard. The second part compensates for the gain difference in $\Delta G$ 126, between data rates and signal formats r and $r_{ref}$, which is caused by the signal distribution change between r and $r_{ref}$. This second part usually cannot be pre-calculated and has to be calibrated, if significant. Whenever the data rate and signal format changes, the appropriate gain adjustment d(r) is applied at the same time because the two paths are delay aligned, as has been described above. In the above calibration, it is assumed that the gain variation in dB caused by data rate and signal format change is nearly independent of that caused by signal level change, which is true in a large range of operation of interest.

Figure 2:
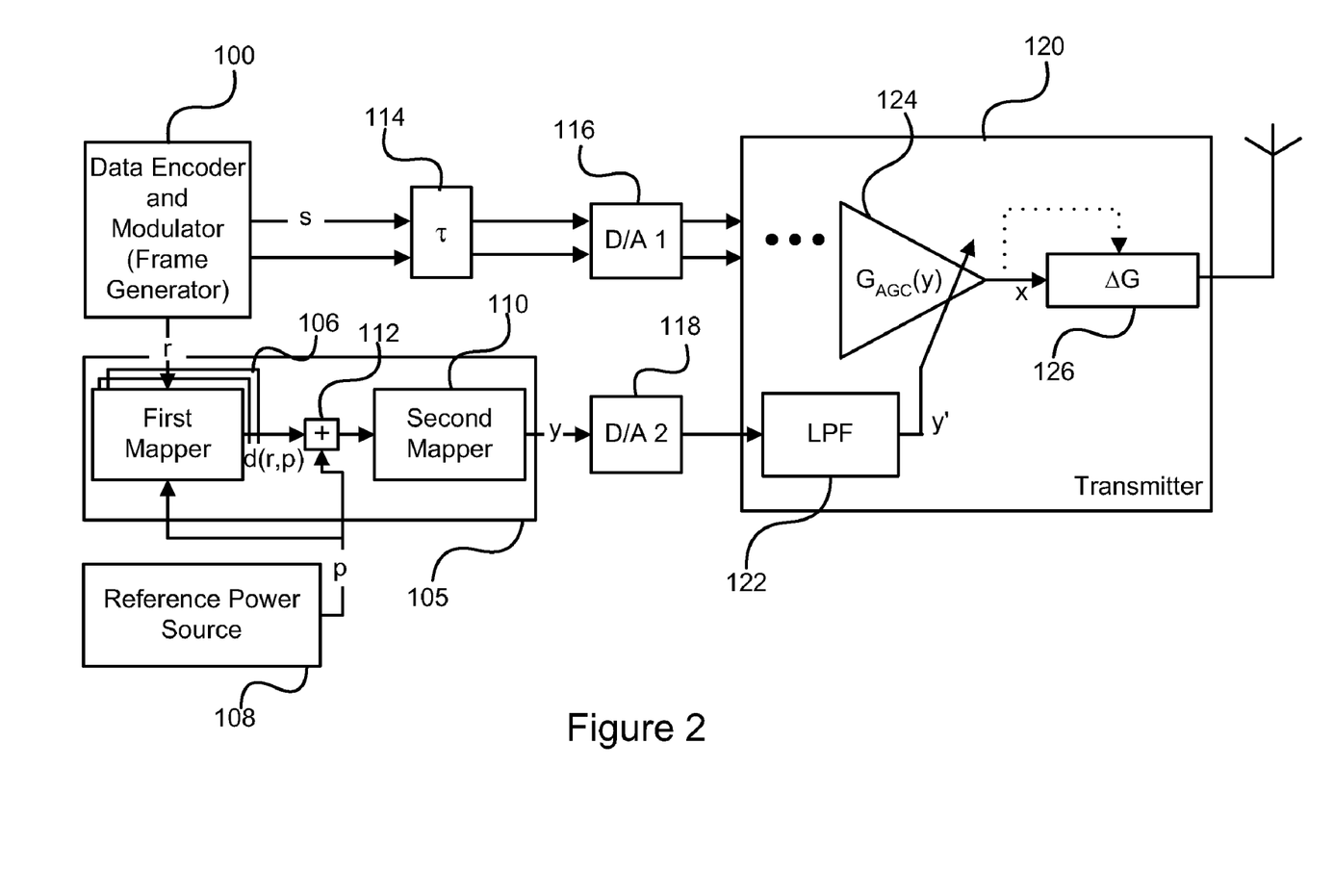
FIG. 2 is a block diagram of a second embodiment of a transmitter system according to the present invention.

In instances where signal level and signal distribution caused gain variations are dependent, an alternative embodiment as shown in FIG. 2 can be used to compensate for the dependent gain variations. Referring to FIG. 2, the first mapper 106 is an array of mappers. The data rate and signal format indicator r is used to select a member mapper within the array. Each member mapper of the array selected in accordance with r receives the desired reference power level p from reference power source 108 and maps it to a corresponding output value d(r, p) in accordance with the values of p and r. Following the mapping of p and r to d(r,p), and after d(r,p) is additively combined with p from reference power source 108 at an adder 112, the combined signal is provided to second mapper 110, which maps the sum of d(r,p) and p to an amplifier control signal y. Other aspects of this embodiment preferably remain the same as in the embodiment shown in FIG. 1.

The method to calibrate the second mapper 110 also remains the same as described hereinabove for the embodiment of FIG. 1. In this instance, the adjustment amount d(r, p) stored in the mapper 106 is calibrated for each data rate and signal format r respectively so that, for each value of the desired reference power level p input to the first mapper 106, the required reference power p is achieved at the antenna.

Figure 3:
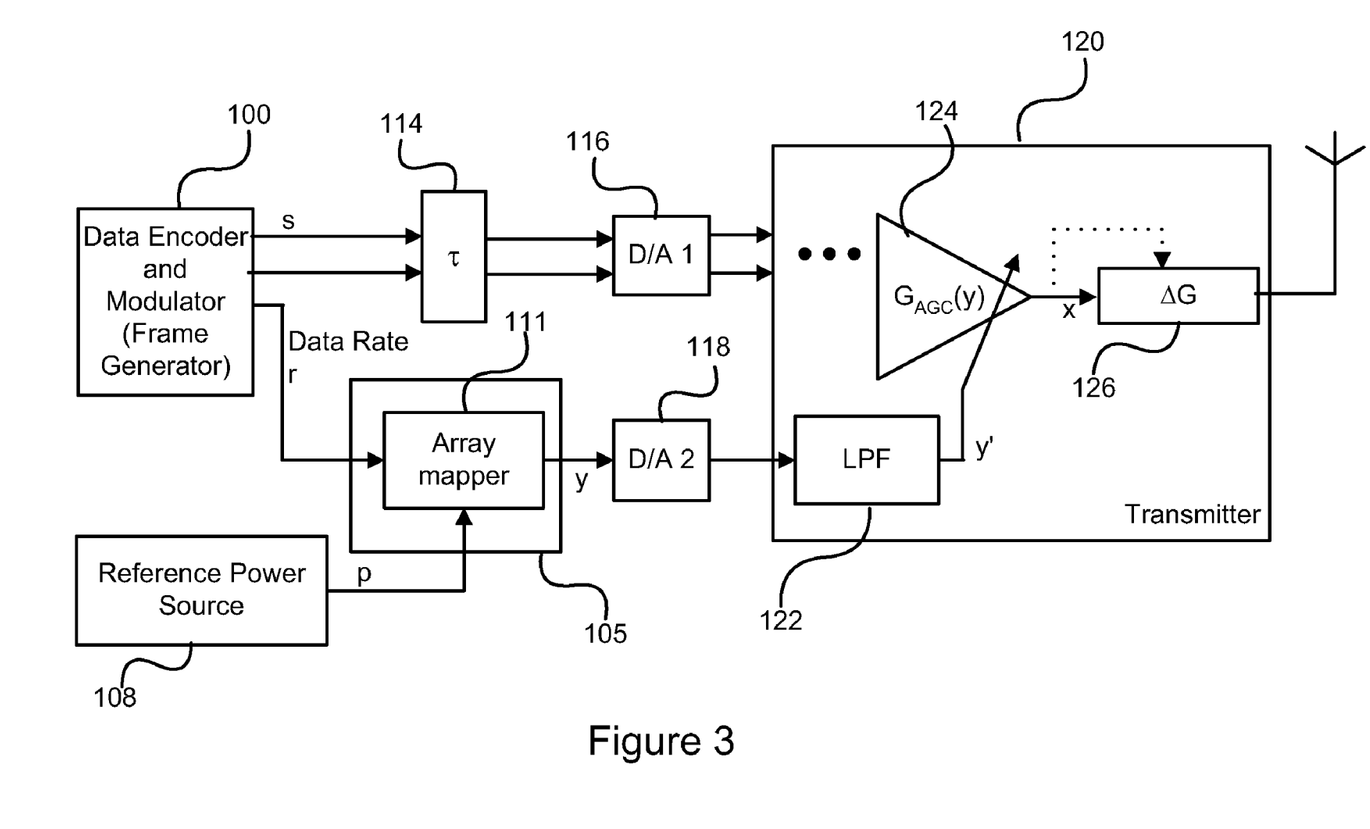
FIG. 3 is a block diagram of a third embodiment of a transmitter system according to the present invention.

Alternatively in a further embodiment, as shown in FIG. 3, the first and second mappers, 106 and 110, and the adder 112 are removed and replaced by an array mapper 111 with two inputs. The first input is the data rate and signal format indicator r provided by the frame generator 100; the second input is the desired reference power p provided by the reference power source 108. The input r selects a member mapper in the array mapper 111 that maps the input p to an output of amplifier control signal y. Other aspects remain the same as in the embodiments in FIG. 1 or FIG. 2. Each of the member mapper contains a mapping table that is calibrated for the corresponding r to get correct reference power value p at the antenna for any value p provided by the reference power source 108.

Figure 4:
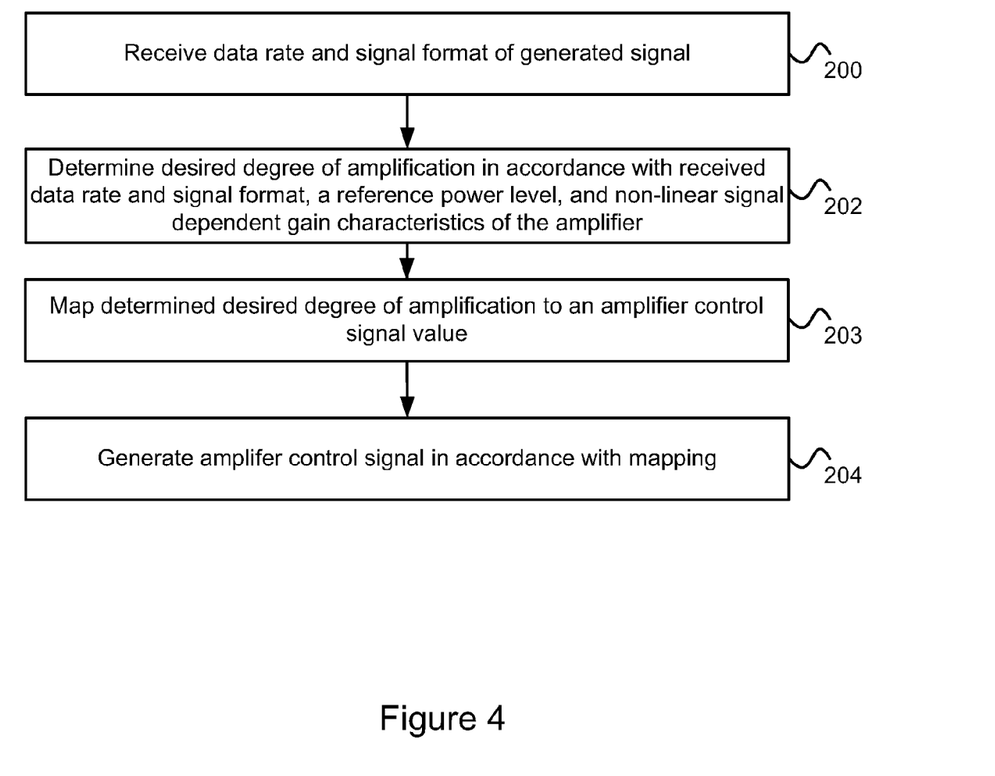
FIG. 4 is a flowchart illustrating a method according to an embodiment of the present invention.

FIG. 4 illustrates a method according to an embodiment of the present invention. In step 200 the data rate and signal format of the generated signal s are received. The desired degree of amplification is determined in accordance with the data rate and signal format of the received signal, the reference power level and pre-calibrated values determined in accordance with the nonlinear characteristics of the amplifiers in step 202. This desired degree of amplification is subsequently mapped to an amplifier control signal value in step 203. The mapping of the desired degree of amplification to the amplifier control signal value is preferably performed in accordance with pre-calibrated values reflecting characteristics of the amplifiers and transmitter system. In step 204, an amplifier control signal is generated in accordance with the mapping of step 203.

Figure 5:
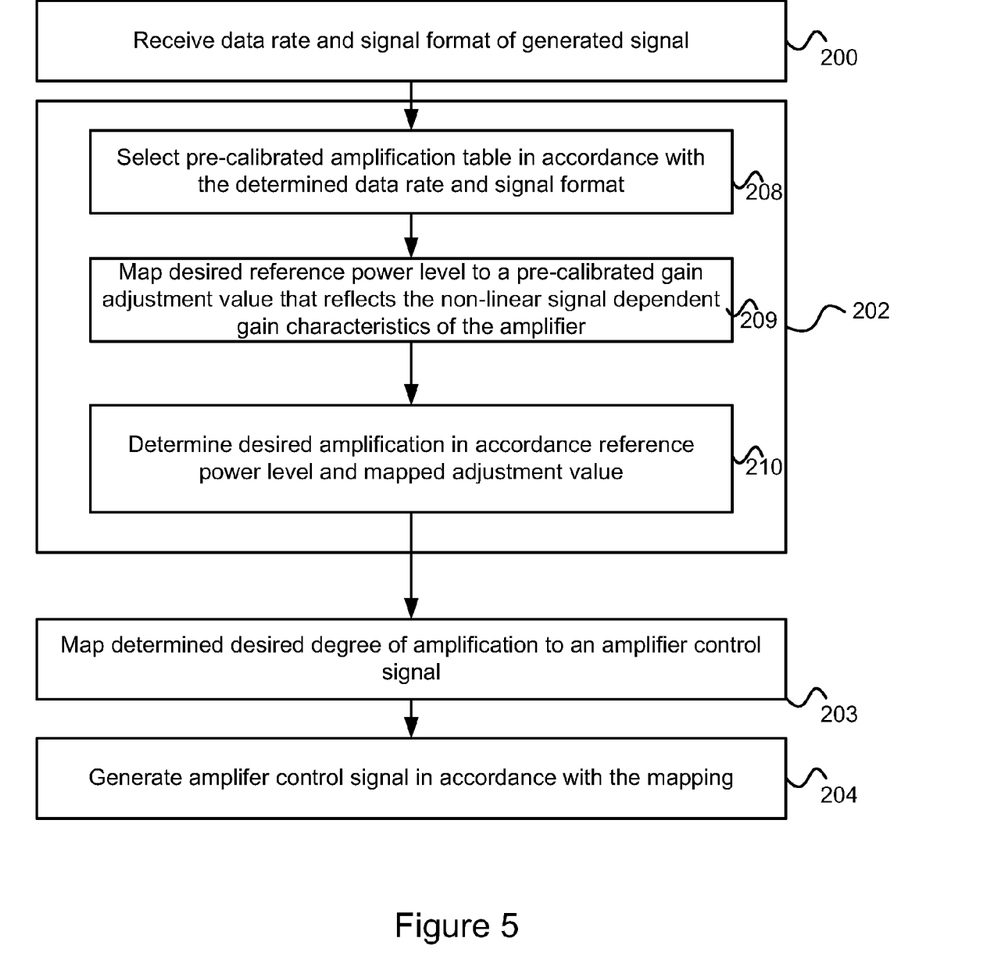
FIG. 5 is a flowchart illustrating a further method according to an embodiment of the present invention.

FIG. 5 illustrates another method according to an embodiment of the present invention. As before, in step 200 the data rate and signal format of the generated signal are received. Step 202, the determination of the desired degree of amplification, is achieved by first selecting a member mapping table in accordance with the determined data rate and signal format as shown in step 208. And then, at step 209, receive the desired reference power level and map it to a pre-calibrated gain adjustment value that reflects the non-linear signal dependent gain characteristics of the amplifiers corresponding to the determined data rate and signal format. In step 210 the degree of amplification is determined in accordance with both the pre-calibrated gain adjustment value and the reference power level. In step 203, the determined desired degree of amplification is mapped to an amplifier control signal value. In step 204, an amplifier control signal is generated in accordance with the mapping of step 203.

Figure 6:
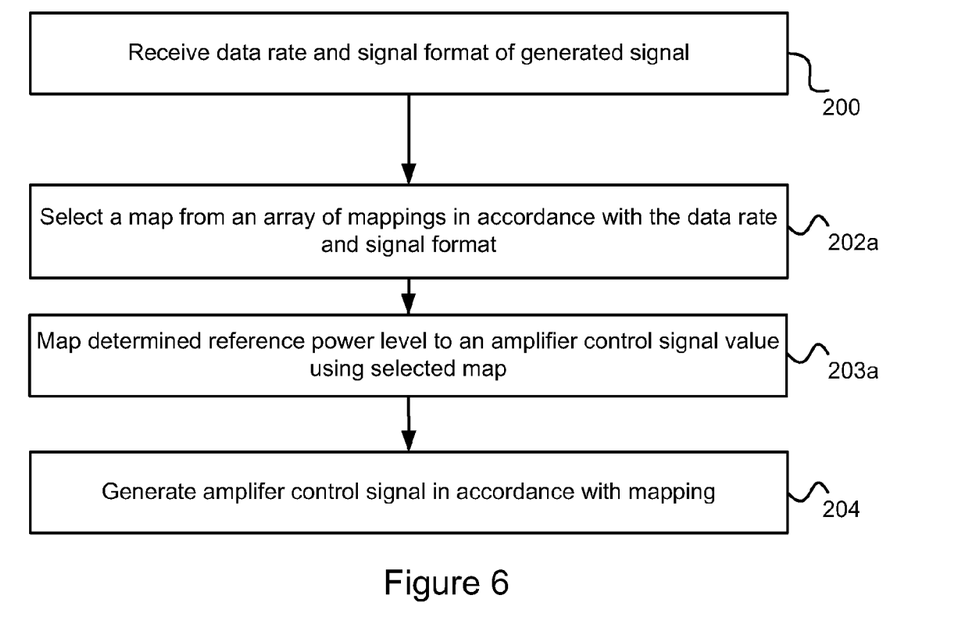
FIG. 6 is a flowchart illustrating a method of an alternate embodiment of the present invention.

For the embodiment employing array mapper 111, there is the exemplary method illustrated in FIG. 6. In step 200, the data rate and signal format of the generated signal are received. Along with the desired reference power level, these values are used, in step 202a, to select one of an array of maps which account for the nonlinearities of the amplifier, much as the degree of amplification was previously determined using the same inputs. The selected mapping is used in step 203a to map the reference power level to an amplifier control signal value. The amplifier control signal value is used in step 204 to generate the amplifier control signal.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A transmitter system for regulating a transmission power level of a wireless signal in a mobile communication device, the transmitter system comprising:
    a frame generator for generating a signal, and a data rate and signal format indicator associated with the signal;
    a reference power source for generating a desired reference power level;
    an amplifier controller for directly mapping the data rate and signal format indicator and the desired reference power level to an amplifier control signal value in accordance with known non-linearities associated with at least one stage of an amplifier that manifests a signal dependent gain, the amplifier controller generating an amplifier control signal in accordance with the amplifier control signal value and independent of the transmission power level of the wireless signal;
    a wireless transmitter including the amplifier, the amplifier for receiving the signal from the frame generator and for amplifying the signal in accordance with the amplifier control signal to regulate the transmission power level of the wireless signal.

2. The transmitter system of claim 1 wherein the amplifier controller includes a mapper for mapping the desired reference power level, the data rate and signal format indicator and known non-linearities associated with the at least one amplifier stage that manifests the signal dependent gain to a degree of amplification, and for mapping the degree of amplification to the amplifier control signal value.

3. The transmitter system of claim 2 further including a delay buffer for receiving and holding the signal from the frame generator and for providing the buffered signal to the amplifier when the amplifier controller generates the amplifier control signal corresponding to the signal.

4. The transmitter system of claim 3 further including:
    a first digital to analog converter for receiving the buffered signal from the delay buffer, for converting the buffered signal to an analog representation, and for providing the analog representation to the amplifier; and
    a second digital to analog converter for receiving from the amplifier controller the amplifier control signal, for converting the amplifier control signal to an analog representation, and for providing the analog representation of the amplifier control signal to the amplifier.

5. The transmitter system of claim 1, wherein the amplifier controller includes:
    a first mapper for receiving from the frame generator the data rate and signal format indicator, and for mapping the data rate and signal format indicator to a gain adjustment value in accordance with pre-calibrated values; and
    a second mapper for receiving the gain adjustment value from the first mapper, for receiving the desired reference power level from the reference power source, and for mapping the desired reference power level and the gain adjustment value to the amplifier control signal value in accordance with the known nonlinearities.

6. The transmitter system of claim 5, wherein the amplifier controller includes an adder for adding the gain adjustment value from the first mapper and the desired reference power level from the reference power source, and for providing the resulting signal to the second mapper.

7. The transmitter system of claim 5, wherein the first mapper includes a lookup table with pre-calibrated entries reflecting the nonlinearities in the transmitter for determining the gain adjustment value in accordance with the data rate and signal format indicator signal, and the second mapper includes a lookup table with pre-calibrated entries reflecting the nonlinearities in the transmitter to determine the amplifier control signal value in accordance with the desired reference power level and the gain adjustment value.

8. The transmitter system of claim 1, wherein the amplifier controller includes a lookup table for determining a degree of amplification in accordance with the desired reference power level, the data rate and the signal format indicator and the known non-linearities of the amplifier.

9. A pre-amplification control system for regulating a transmission power level of a wireless signal in a mobile communication device, the pre-amplifier control system comprising:
    a frame generator for generating a signal, and a data rate and signal format indicator associated with the signal;
    a reference power source for generating a desired reference power level;
    an amplifier controller for directly mapping the data rate and signal format indicator and the desired reference power level to an amplifier control signal value in accordance with known non-linearities associated with at least one stage of an amplifier that manifests a signal dependent gain, the amplifier controller generating an amplifier control signal in accordance with the amplifier control signal value, independent of the transmission power level of the wireless signal, to regulate the transmission power level of the wireless signal.

10. The pre-amplification control system of claim 9 wherein the amplifier controller includes a mapper for mapping the desired reference power level, the data rate and signal format indicator and known non-linearities associated with the at least one amplifier stage that manifests the signal dependent gain to a degree of amplification, and for mapping the degree of amplification to the amplifier control signal value.

11. The pre-amplification control system of claim 10 further including a delay buffer for receiving and holding the signal from the frame generator and for providing the buffered signal to the amplifier when the amplifier controller generates the amplifier control signal corresponding to the signal.

12. The pre-amplification control system of claim 11 further including:
- a first digital to analog converter for receiving the buffered signal from the delay buffer, for converting the buffered signal to an analog representation, and for providing the analog representation to the amplifier; and
- a second digital to analog converter for receiving from the amplifier controller the amplifier control signal, for converting the amplifier control signal to an analog representation, and for providing the analog representation of the amplifier control signal to the amplifier.

13. The pre-amplification control system of claim 9, wherein the amplifier controller includes:
- a first mapper for receiving from the frame generator the data rate and signal format indicator, and for mapping the data rate and signal format indicator to a gain adjustment value in accordance with pre-calibrated values; and
- a second mapper for receiving the gain adjustment value from the first mapper, for receiving the desired reference power level from the reference power source, and for mapping the desired reference power level and the gain adjustment value to the amplifier control signal value in accordance with the known nonlinearities.

14. The pre-amplification control system of claim 13, wherein the amplifier controller includes an adder for adding the gain adjustment value from the first mapper and the desired reference power level from the reference power source, and for providing the resulting signal to the second mapper.

15. The pre-amplification control system of claim 13, wherein the first mapper includes a lookup table with pre-calibrated entries reflecting the nonlinearities in the transmitter for determining the gain adjustment value in accordance with the data rate and signal format indicator signal, and the second mapper includes a lookup table with pre-calibrated entries reflecting the nonlinearities in the transmitter to determine the amplifier control signal value in accordance with the desired reference power level and the gain adjustment value.

16. The pre-amplification control system of claim 9, wherein the amplifier controller includes a lookup table for determining a degree of amplification in accordance with the desired reference power level, the data rate and the signal format indicator and the known non-linearities of the amplifier.

17. A method of generating an amplifier control signal for regulating a transmission power level of a wireless signal in a mobile communication device, the mobile device having a frame generator, an amplifier with at least one stage that manifests a signal dependent gain, an amplifier controller, and a reference power source, the method comprising:
- receiving a data rate and signal format indicator signal associated with a signal generated by the frame generator;
- determining a desired degree of amplification directly in accordance with the data rate and signal format signal, a desired reference power level received from the reference power source, and nonlinearities associated with the signal dependent gain;
- mapping the determined degree of amplification to an amplifier control signal value; generating an amplifier control signal in accordance with the mapped amplifier control signal value, independent of the transmission power level of the wireless signal, to regulate the transmission power level of the wireless signal.

18. The method of claim 17, wherein the step of determining the degree of amplification includes performing a table lookup in accordance with the data rate and signal format indicator signal, the desired reference power level, and the nonlinearities associated with the signal dependent gain.

19. The method of claim 17, wherein the step of determining the degree of amplification includes selecting one of a plurality of lookup tables with pre-calibrated entries reflecting non-linearities in the amplifier, in accordance with the data rate and signal format indicator signal, performing a table lookup in accordance with the desired reference power level.

20. The method of claim 17, further including the step of filtering the generated amplifier control signal, prior to the step of amplifying, to prevent rapid changes in the degree of amplification.

* * * * *